United States Patent
Shanks

(10) Patent No.: US 7,538,679 B2
(45) Date of Patent: May 26, 2009

(54) RFID TAG TEST ANTENNA WITH TWO PORTS THAT EXCITE PERPENDICULAR MODES

(75) Inventor: Wayne E. Shanks, Baltimore, MD (US)

(73) Assignee: Symbol Technologies, Inc., Holtsville, NY (US)

( * ) Notice: Subject to any disclaimer, the term of this patent is extended or adjusted under 35 U.S.C. 154(b) by 387 days.

(21) Appl. No.: 11/593,587

(22) Filed: Nov. 7, 2006

(65) Prior Publication Data

US 2008/0106378 A1    May 8, 2008

(51) Int. Cl.
     *G08B 13/14*      (2006.01)
     *H04Q 5/22*      (2006.01)

(52) U.S. Cl. ................. 340/572.1; 340/572.7; 340/10.1

(58) Field of Classification Search ....... 340/10.1–10.6, 340/572.1–572.9; 324/513, 519–527, 529, 324/530; 343/703, 720, 760, 824
See application file for complete search history.

(56) References Cited

U.S. PATENT DOCUMENTS 6,104,291 A * 8/2000 Beauvillier et al. ...... 340/572.1
7,020,443 B2 * 3/2006 Talvitie et al. ........... 455/67.14
2005/0282495 A1 * 12/2005 Forster ...................... 455/41.2

* cited by examiner

*Primary Examiner*—Toan N Pham
*Assistant Examiner*—Jennifer Mehmood

(57) ABSTRACT

Methods, systems, and apparatuses for RFID devices, such as tag test methods, are described. A tag of a strip of tags is positioned adjacent to an opening in an electrically conductive sheet, the tag having first and second orthogonally polarized antennas. A first RF test signal is transmitted through the opening to test the first antenna of the tag. The tag is positioned such that the first RF test signal has a polarization substantially the same as the first antenna and substantially orthogonal to a polarization of the second antenna. A second RF test signal is transmitted through the opening to test the second antenna of the tag. The tag is positioned such that the second RF test signal has a polarization substantially the same as the second antenna and substantially orthogonal to the polarization of the first antenna. If proper responses to both of the first and second RF test signals are received, the tag has passed the test. This test may be repeated for further tags in the strip of tags as desired.

31 Claims, 10 Drawing Sheets

RFID TAG TEST ANTENNA WITH TWO PORTS THAT EXCITE PERPENDICULAR MODES

BACKGROUND OF THE INVENTION

1. Field of the Invention

The invention relates to radio frequency identification (RFID) technology, and in particular, to RFID tag testing apparatuses.

2. Background Art

Radio frequency identification (RFID) tags are electronic devices that may be affixed to items whose presence is to be detected and/or monitored. The presence of an RFID tag, and therefore the presence of the item to which the tag is affixed, may be checked and monitored wirelessly by devices known as "readers." Readers typically have one or more antennas transmitting radio frequency signals to which tags respond. Since the reader "interrogates" RFID tags, and receives signals back from the tags in response to the interrogation, the reader is sometimes termed as "reader interrogator" or simply "interrogator".

With the maturation of RFID technology, efficient communication between tags and interrogators has become a key enabler in supply chain management, especially in manufacturing, shipping, and retail industries, as well as in building security installations, healthcare facilities, libraries, airports, warehouses etc.

Readers may test the operability of tags by transmitting an RF signal and determining whether responses are received from the tags. Many conventional tags include multiple antennas. However, conventional readers are not capable of separately testing the antennas of a tag that has multiple antennas. Moreover, conventional tags are not capable of facilitating such testing.

What is needed, then, is a method and system that addresses the aforementioned shortcomings of conventional readers and testing systems.

BRIEF SUMMARY OF THE INVENTION

Methods, systems, and apparatuses for improved tag testing apparatuses, are described herein. Tag testing apparatuses described herein allow for testing individual antennas of an RFID tag.

In a first aspect, a tag test apparatus includes a conductive sheet. The conductive sheet has an opening through a center portion. A first surface and a second surface of the conductive sheet are configured to accommodate a strip of tags. The opening is configured to accommodate one tag of the strip of tags. The tag test apparatus also includes an antenna. The antenna is placed adjacent to the opening. The antenna radiates at least a first electromagnetic wave toward the opening and a second electromagnetic wave toward the opening. The first and second electromagnetic waves include test signals for the tag at the opening.

In an aspect, the tag receives the first electromagnetic wave at a first tag antenna and receives the second electromagnetic wave at a second antenna. The first electromagnetic wave is not substantially received by the second antenna, and the second electromagnetic wave is not substantially received by the first antenna. For example, in an aspect, the first electromagnetic wave is polarized orthogonally to the second electromagnetic wave. Furthermore, the polarization of the first electromagnetic wave is aligned with a polarization of the first tag antenna, and the polarization of the second electromagnetic wave is aligned with a polarization of the second tag antenna.

In a further aspect, the conductive sheet grounds tags of the strip of tags other than the tag at the opening to prevent the other tags from responding to test signals of the first and second electromagnetic waves.

In another aspect, a test antenna includes a substrate having opposing first and second surfaces, wherein the first surface of the substrate includes a patch of a conductive material. An input signal to a first port at a first location causes the antenna to radiate a first electromagnetic wave with a first polarization. An input signal to a second port at a second location causes the antenna to radiate a second electromagnetic wave with a second polarization, wherein the first polarization and the second polarization are orthogonal to each other.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
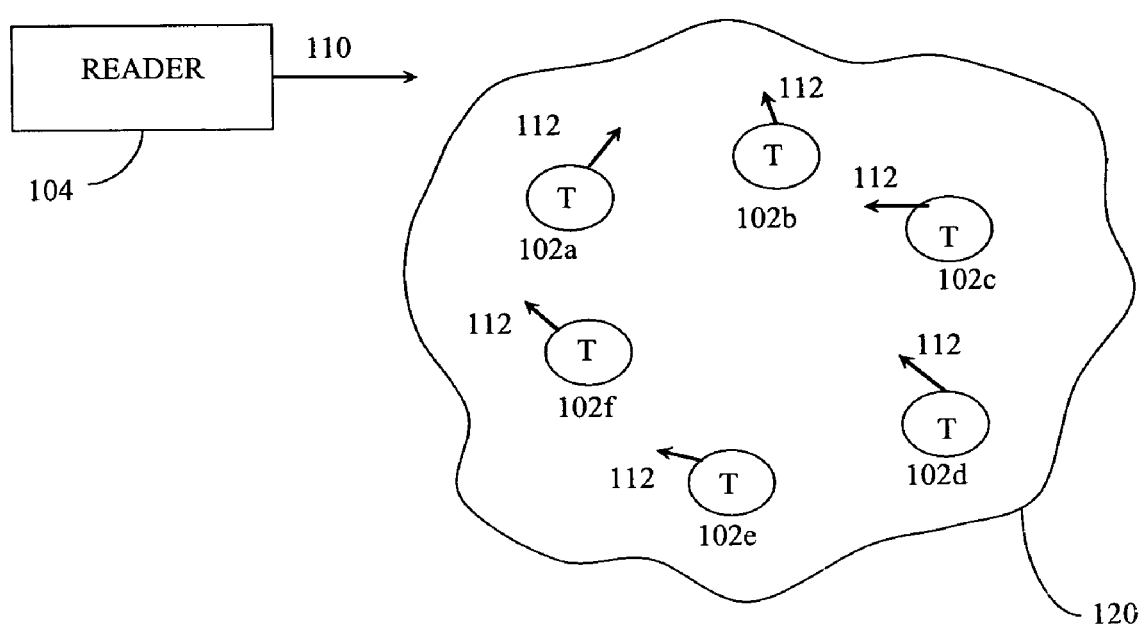
FIG. 1 shows an environment where RFID readers communicate with an exemplary population of RFID tags.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

Methods, systems, and apparatuses for improved RFID tag testing apparatuses are described herein. Testing apparatuses described herein provide the capability to individually test multiple antennas of an RFID tag.

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "down," "top," "bottom," "vertical," "horizontal," etc.) used herein are for purposes of illustration only, and that practical implementations of the structures described herein can be spatially arranged in any orientation or manner.

EXAMPLE RFID SYSTEM EMBODIMENT

Before describing embodiments of the present invention in detail, it is helpful to describe an example RFIID communications environment in which the invention may be implemented. FIG. 1 illustrates an environment where RFID tag readers 104 communicate with an exemplary population 120 of REID tags 102. As shown in FIG. 1, the population 120 of tags includes seven tags 102a-102g. A population 120 may include any number of tags 102.

Environment includes one or more readers 104. A reader 104 may be requested by an external application to address the population of tags 120. Alternatively, reader 104 may have internal logic that initiates communication, or may have a trigger mechanism that an operator of reader 1 04a uses to initiate communication.

As shown in FIG. 1, reader 104 transmits an interrogation signal 110 having a carrier frequency to the population of tags 120. Reader 104 operates in one or more of the frequency bands allotted for this type of RF communication. For example, frequency bands of 902-928 MHz and 2400-2483.5 MHz have been defined for certain RFID applications by the Federal Communication Commission (FCC).

Various types of tags 102 may be present in tag population 120 that transmit one or more response signals 112 to an interrogating reader 104, including by alternatively reflecting and absorbing portions of signal 110 according to a time-based pattern or frequency. This technique for alternatively absorbing and reflecting signal 110 is referred to herein as backscatter modulation. Readers 104 receive and obtain data from response signals 112, such as an identification number of the responding tag 102. In the embodiments described herein, a reader may be capable of communicating with tags 102 according to any suitable communication protocol, including binary traversal protocols, slotted aloha protocols, Class 0, Class 1, EPC Gen 2, any others mentioned elsewhere herein, and future communication protocols.

Figure 2:
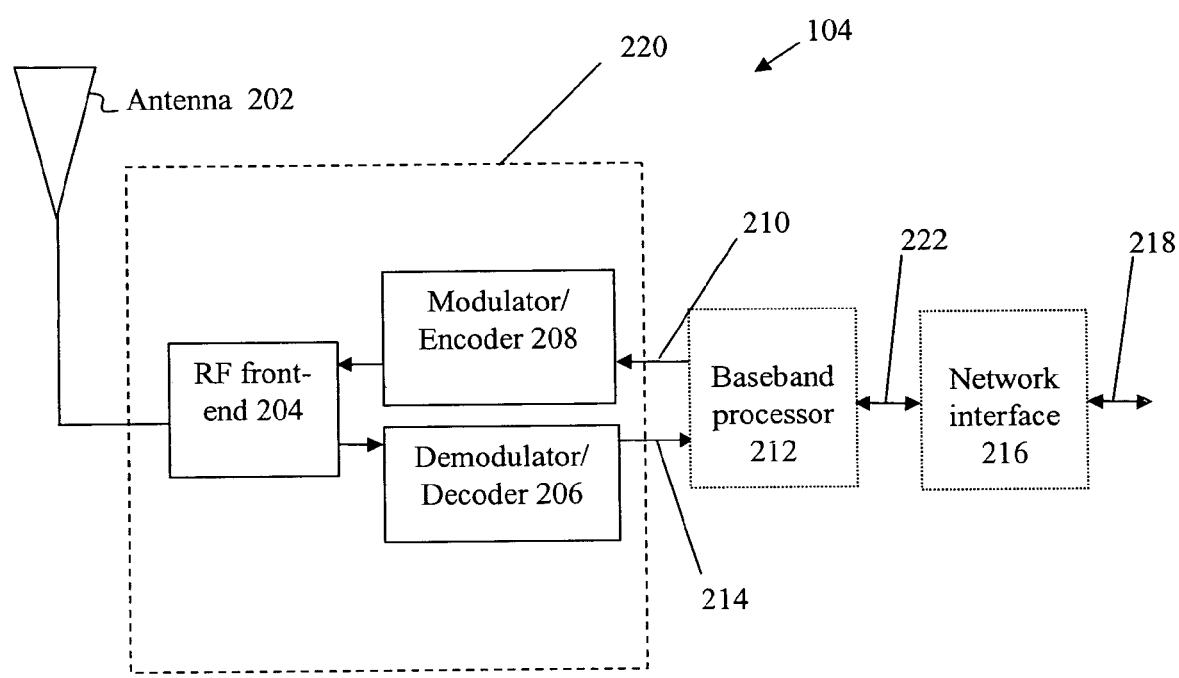
FIG. 2 shows a block diagram of receiver and transmitter portions of a RFID reader.

FIG. 2 shows a block diagram of an example RFID reader 104. Reader 104 includes one or more antennas 202, a receiver and transmitter portion 220 (also referred to as transceiver 220), a baseband processor 212, and a network interface 216; These components of reader 104 may include software, hardware, andlor firmware, or any combination thereof, for performing their functions.

Baseband processor 212 and network interface 216 are optionally present in reader 104. Baseband processor 212 may be present in reader 104, or may be located remote from reader 104. For example, in an embodiment, network interface 216 may be present in reader 104, to communicate between transceiver portion 220 and a remote server that includes baseband processor 212. When baseband processor 212 is present in reader 104, network interface 216 may be optionally present to communicate between baseband processor 212 and a remote server. In another embodiment, network interface 216 is not present in reader 104.

In an embodiment, reader 104 includes network interface 216 to interface reader 104 with a communications network 218. As shown in FIG. 2, baseband processor 212 and network interface 216 communicate with each other via a communication link 222. Network interface 216 is used to provide an interrogation request 210 to transceiver portion 220 (optionally through baseband processor 212), which may be received from a remote server coupled to communications network 218. Baseband processor 212 optionally processes the data of interrogation request 210 prior to being sent to transceiver portion 220. Transceiver 220 transmits the interrogation request via antenna 202.

Reader 104 has at least one antenna 202 for communicating with tags 102 and/or other readers 104. Antenna(s) 202 may be any type of reader antenna known to persons skilled in the relevant art(s), including a vertical, dipole, loop, Yagi-Uda, slot, or patch antenna type. For description of an example antenna suitable for reader 104, refer to U.S. Ser. No. 11/265,143, filed Nov. 3, 2005, titled "Low Return Loss Rugged RFID Antenna," now pending, which is incorporated by reference herein in its entirety.

Transceiver 220 receives a tag response via antenna 202. Transceiver 220 outputs a decoded data signal 214 generated from the tag response. Network interface 216 is used to transmit decoded data signal 214 received from transceiver portion 220 (optionally through baseband processor 212) to a remote server coupled to communications network 218. Baseband processor 212 optionally processes the data of decoded data signal 214 prior to being sent over communications network 218.

In embodiments, network interface 216 enables a wired and/or wireless connection with communications network 218. For example, network interface 216 may enable a wireless local area network (WLAN) link (including a IEEE 802.11 WLAN standard link), a BLUETOOTH link, and/or other types of wireless communication links. Communications network 218 may be a local area network (LAN), a wide area network (WAN) (e.g., the Internet), and/or a personal area network (PAIN).

In embodiments, a variety of mechanisms may be used to initiate an interrogation request by reader 104. For example, an interrogation request may be initiated by a remote computer system/server that communicates with reader 104 over communications network 218. Alternatively, reader 104 may include a finger-trigger mechanism, a keyboard, a graphical user interface (GUI), and/or a voice activated mechanism with which a user of reader 104 may interact to initiate an interrogation by reader 104.

In the example of FIG. 2, transceiver portion 220 includes a RF front-end 204, a demodulator/decoder 206, and a modulator/encoder 208. These components of transceiver 220 may include software, hardware, and/or firmware, or any combination thereof, for performing their functions. Example description of these components is provided as follows.

Modulator/encoder 208 receives interrogation request 210, and is coupled to an input of RF front-end 204. Modulator/encoder 208 encodes interrogation request 210 into a signal format, modulates the encoded signal, and outputs the modulated encoded interrogation signal to RF front-end 204. For example, pulse-interval encoding (PIE) may be used in a Gen 2 embodiment. Furthermore, double sideband amplitude shift keying (DSB-ASK), single sideband amplitude shift keying (SSB-ASK), or phase-reversal amplitude shift keying (PR-ASK) modulation schemes may be used in a Gen 2 embodiment. Note that in an embodiment, baseband processor 212 may alternatively perform the encoding function of modulator/encoder 208.

RF front-end 204 may include one or more antenna matching elements, amplifiers, filters, an echo-cancellation unit, a down-converter, and/or an up-converter. RF front-end 204 receives a modulated encoded interrogation signal from modulator/encoder 208, up-converts (if necessary) the interrogation signal, and transmits the interrogation signal to antenna 202 to be radiated. Furthermore, RE front-end 204 receives a tag response signal through antenna 202 and down-converts (if necessary) the response signal to a frequency range amenable to further signal processing.

Demodulator/decoder 206 is coupled to an output of RF front-end 204, receiving a modulated tag response signal from RF front-end 204. In an EPC Gen 2 protocol environment, for example, the received modulated tag response signal may have been modulated according to amplitude shift keying (ASK) or phase shift keying (PSK) modulation techniques. Demodulator/decoder 206 demodulates the tag response signal. For example, the tag response signal may include backscattered data formatted according to FM0 or Miller encoding formats in an EPC Gen 2 embodiment. Demodulator/decoder 206 outputs decoded data signal 214. Note that in an embodiment, baseband processor 212 may alternatively perform the decoding function of demodulator/decoder 206.

Example Embodiments for RFID Testing Apparatuses

Methods, systems, and apparatuses for the testing of RFID tags are presented. In an embodiment, a testing apparatus tests one or more antennas of a tag. The tag testing apparatus includes a conductive sheet, wherein the conductive sheet is configured to accommodate a strip of tags. The conductive sheet has an opening through opposing first and second surfaces. The opening is configured to accommodate one tag of the strip of tags. The tag testing apparatus also includes an antenna. The antenna radiates at least a first electromagnetic wave toward the opening and a second electromagnetic wave toward the opening, wherein a polarization of the first electromagnetic wave is orthogonal to a polarization of the second electromagnetic wave. In this manner, orthogonal antennas of a tag can be tested separately.

The example embodiments described herein are provided for illustrative purposes, and are not limiting. The examples described herein may be adapted to any type of RFID tag testing apparatus. Further structural and operational embodiments, including modifications/alterations, will become apparent to persons skilled in the relevant art(s) from the teachings herein.

Figure 3:
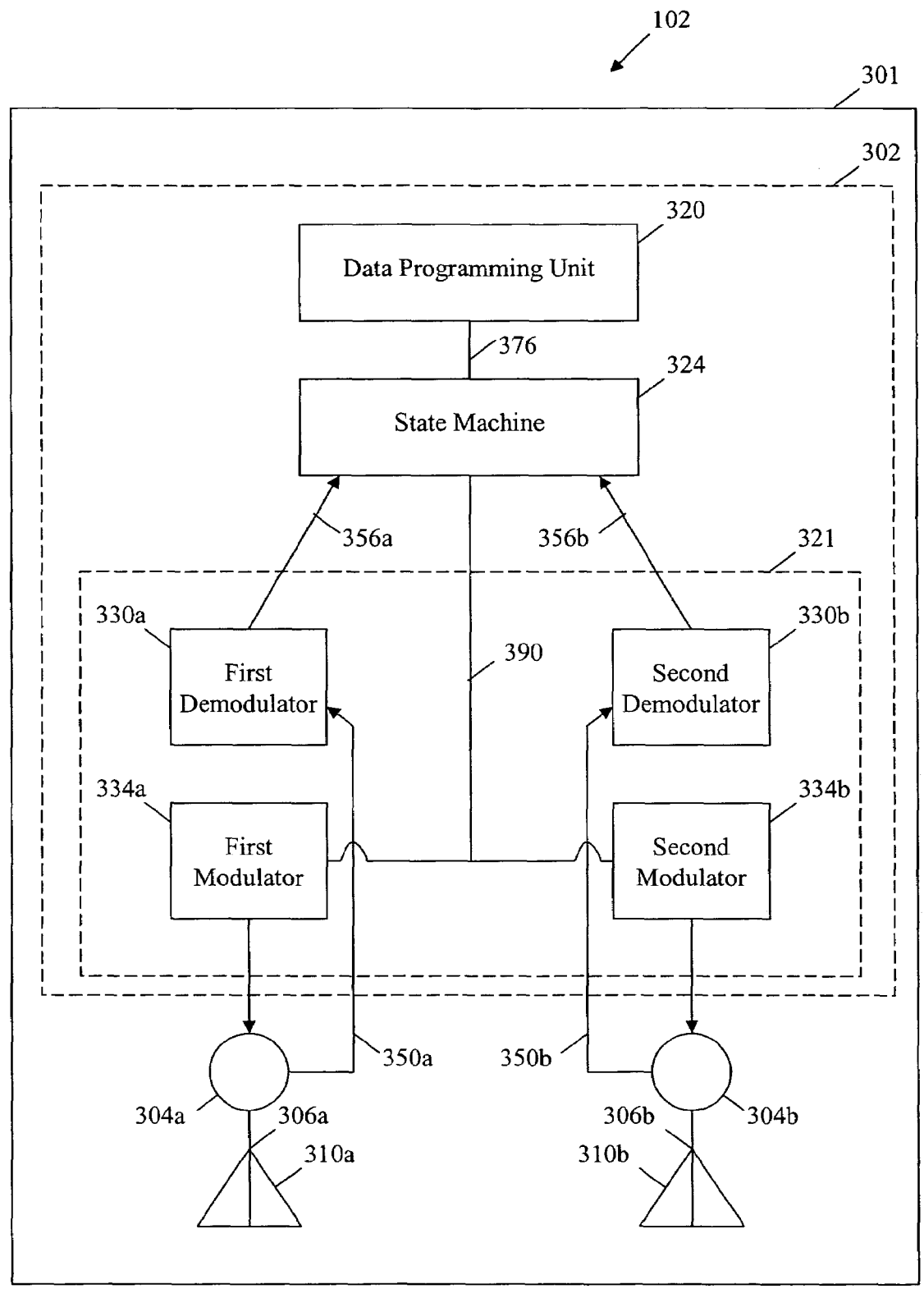
FIG. 3 shows a block diagram of an example RFID tag.

The present invention is applicable to any type of RFID tag. FIG. 3 is an exemplary block diagram of a tag 102, according to an embodiment of the present invention. Tag 102 is a dual antenna type tag. Tag 102 includes an integrated circuit 302, first and second pads 304a-b, and first and second antennas 310a-b. These components are mounted or formed on a substrate 301 and are described in further detail below.

Pads 304 provide electrical connections between integrated circuit 302 and other components related to tag 102. For instance, first RF pad 304a establishes a connection between integrated circuit 302 and first antenna 310a. Second RF pad 304b provides a connection between integrated circuit 302 and second antenna 310b.

First and second antennas 310a and 310b may be any type of antennas, including including dipole, loop, slot, or patch antenna type.

Integrated circuit 302 may be implemented across more than one integrated circuit chip, but is preferably implemented in a single chip. The one or more chips of integrated circuit 302 are created in one or more wafers made by a wafer fabrication process. Wafer fabrication process variations may cause performance differences between chips. For example, the process of matching inductances of a chip may be affected by fabrication process differences from wafer-to-wafer, lot-to-lot and die-to-die.

Integrated circuit 302 is mounted to substrate 301. First and second antennas 310a-b are printed or otherwise formed on substrate 301. In an embodiment, the materials used for substrate 301 are 3-5 Mil MYLAR™ or MYLAR™-like materials. The MYLAR™ related materials have relatively low dielectric constants and beneficial printing properties, as compared to many other materials. Conductive inks used to print an antenna design are cured at very high temperatures. These high temperatures can cause standard polymers to degrade quickly as well as become very unstable to work with.

As shown in FIG. 3, integrated circuit 302 includes a data programming unit 320, a state machine 324, and an RF interface portion 321. Data programming unit 320 temporarily or permanently stores information that is received from state machine 324. The information may include an identification number associated with tag 102, a parameter that may be utilized in accordance with a custom command received from reader 104, or other information.

State machine 324 controls the operation of RFID tag 102, based on information received from data programming unit 320 and/or RF interface portion 321. For example, state machine 324 accesses data programming unit 320 via a bus 376 to determine whether tag 102 is to transmit a logical "1", a logical "0", or combinations of "1" and "0" bits. An identification number associated with tag 102 is stored in data programming unit 320, and state machine 324 accesses one or more bits of the identification number to determine if the particular tag is being addressed, or if the identification number is to be provided in a response. State machine 324 may operate according to a binary traversal protocol (e.g., EPC Class 0), a slotted Aloha type protocol (e.g., EPC Class 1, EPC Gen 2), or other RFID protocol. State machine 324 may include software, firmware, and/or hardware, or any combination thereof. For example, state machine 324 may include digital circuitry, such as logic gates.

RF interface portion 321 is coupled to first and second antennas 310a-b to provide a bi-directional communication interface with reader 104. In an embodiment, RF interface portion 321 includes components that modulate digital information symbols into RF signals, and demodulate RF signals into digital information symbols. In another embodiment, RF interface portion 321 includes components that convert a wide range of RF power and voltage levels in the signals received from first and second antennas 310a-b into usable signals. For example, the signals may be converted to the form of transistor usable direct current (DC) voltage signals that may have substantially greater or lesser magnitudes than signals radiated to reader 104 by first and second antennas 310a-b.

Referring to FIG. 3, RF interface portion 321 includes first and second demodulators 330a-b and first and second modulators 334a-b. First demodulator 330a and first modulator 334a are coupled to first antenna 310a. Second demodulator 330b and second modulator 334b are coupled to second antenna 310b. In the embodiment of FIG. 3, first and second modulators 334a-b perform backscatter modulation of data from state machine 324.

In the example embodiment of FIG. 3, first and second demodulators 330a-b demodulate and provide respective first and second received signals 356a-b to state machine 324. Furthermore, first and second modulators 334a-b modulate a response data signal 390 received from state machine 324. The modulated signals output by first and second modulators 334a-b are respectively radiated from antennas 310a and 310b.

Tag 102 may be configured differently from the embodiment of FIG. 3, may include additional functionality, including a power generation circuit such as a charge pump, an impedance matching network, and/or other functionality, as would be known to persons skilled in the relevant art(s).

FIG. 3 shows tag 102 as having two antennas—antenna 310a and antenna 310b. In an embodiment, antenna 310a has a first polarization and antenna 310b has a second polarization. The polarization of antenna 310a is orthogonal to the polarization of antenna 310b. A polarization of an antenna is a vector defined by a polarization of an electric field component of an electromagnetic wave radiated by the antenna. The polarization of the antenna is, then, dependent upon an orientation of the antenna. A comparison of two or more polarizations (antennas polarizations or electromagnetic field component polarizations) may be facilitated if the polarization vectors are projected onto an identically oriented coordinate axis. A first polarization relative to a second polarization is defined as the first polarization vector projected onto a coordinate axis used to define the second polarization vector. The first polarization may be orthogonal to the second polarization if a dot product between the first polarization vector relative to the second polarization and the second polarization vector is zero.

In the case of antennas, if a transmitting antenna with a first polarization transmits an electromagnetic wave incident to a receiving antenna with a second polarization, no signal power will be received if the first polarization is orthogonal to the second polarization. On the other hand, all incident power will be received if the first polarization is the same as the second polarization, i.e. a dot product between the first and second polarization is either 1 or −1.

Since, in the current embodiment, the polarization of antenna 310a is orthogonal to the polarization of antenna 310b, tag 102 is able to receive incoming signals of a wider range of polarizations compared to a tag with a single antenna.

Figure 4:
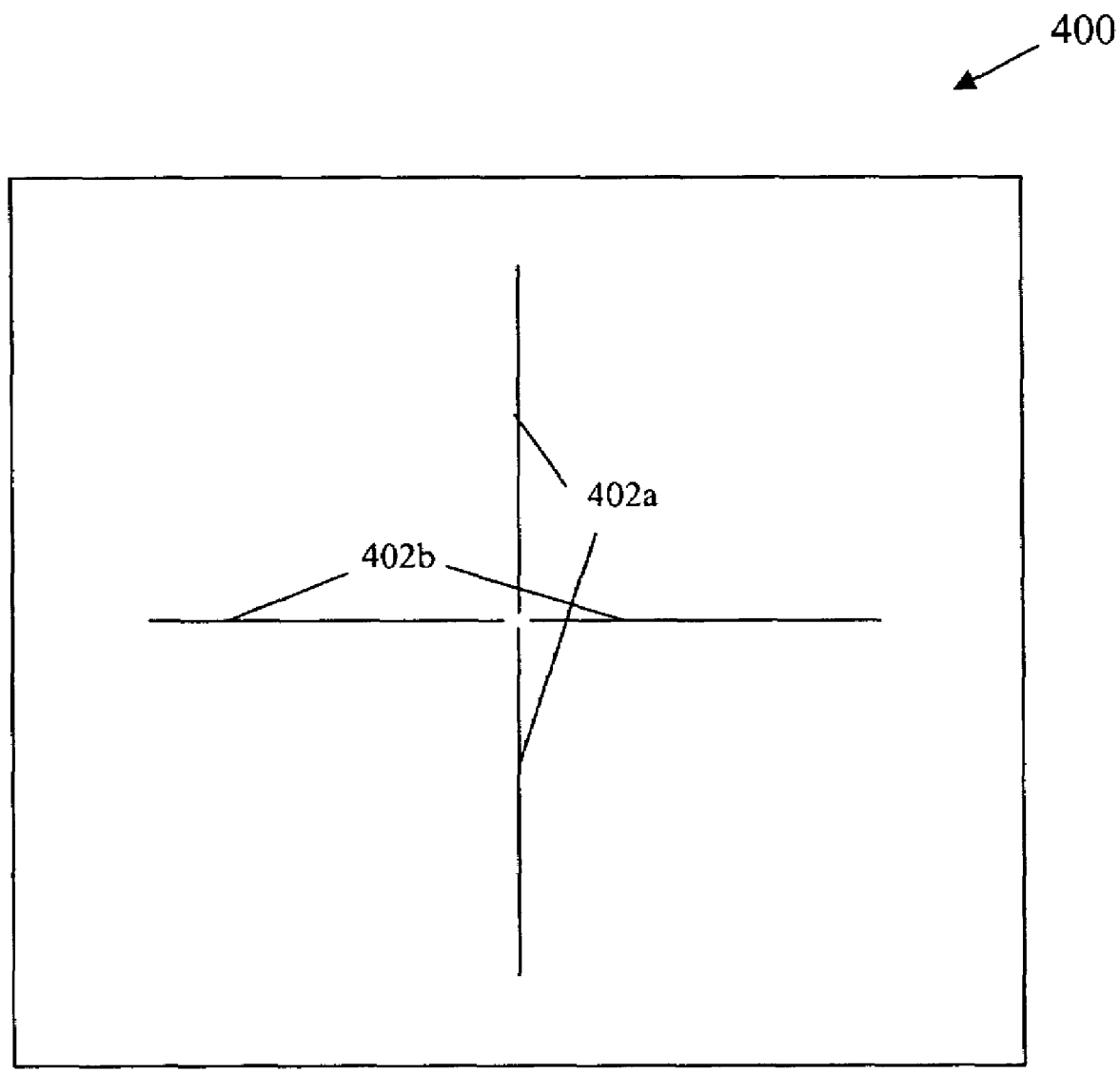
FIG. 4 shows a top view of a typical RFID tag antenna configuration.

In an embodiment, antennas 310a and 310b are dipole antennas configured in an orthogonal configuration as such shown in FIG. 4. FIG. 4 shows a top view of an antenna layout 400 including dipole antennas 402a and 402b. Antennas 402a and 402b are oriented orthogonally so that they can receive signals with a wider range of polarizations than a single dipole antenna.

Figure 5A:
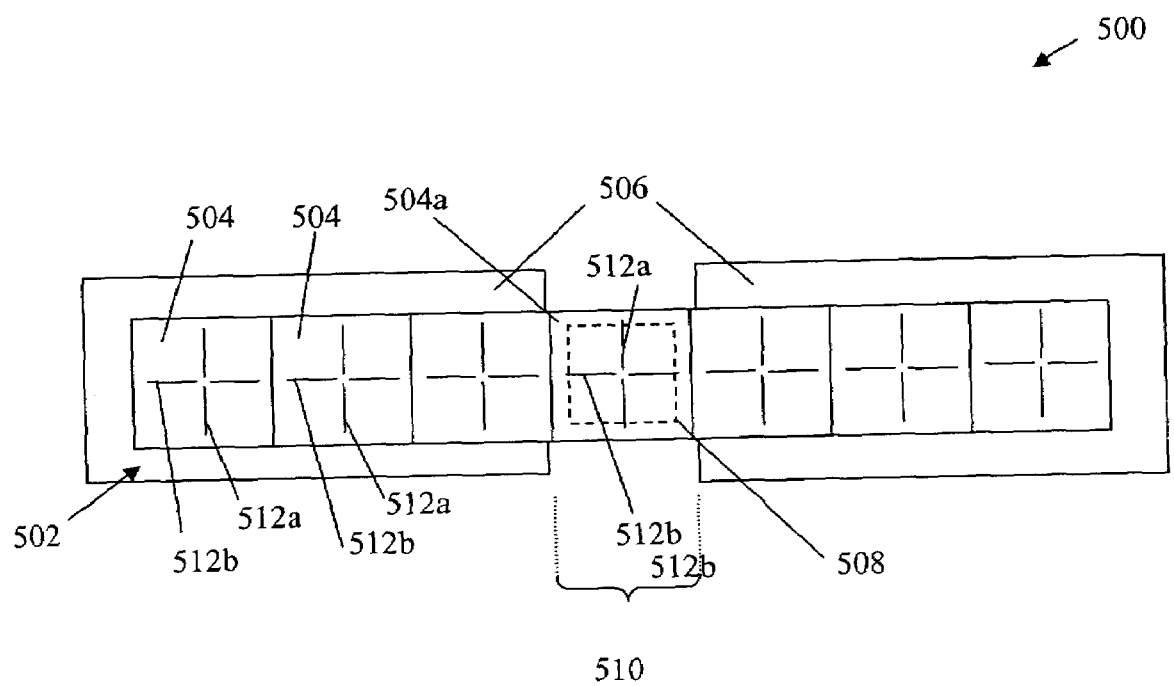
FIGS. 5A and 5B show top and side views respectively of a RFID tag testing apparatus, according to an embodiment of the present invention.
Figure 5B:
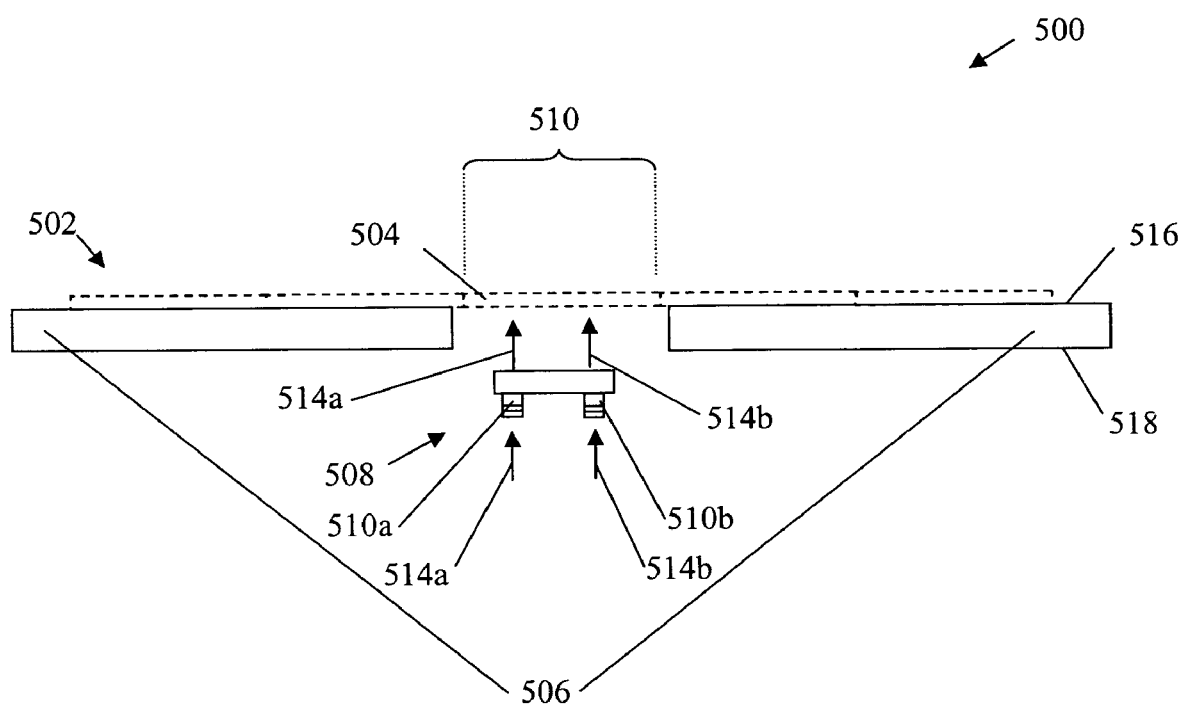

FIGS. 5A and 5B show top and side views, respectively, of a tag testing apparatus 500, according to an embodiment of the present invention. As shown in FIG. 5A, tag testing apparatus 500 includes a conductive sheet 506 and an antenna 508.

Apparatus 500 receives a strip 502 including tags 504 to be tested. FIGS. 5A and 5B show conductive sheet 506 to be substantially planar and rectangular when viewed from both a top view and side view. However, in alternate embodiments, conductive sheet 506 can be curved or have other shapes. In an embodiment, conductive sheet 506 has opposing top and bottom surfaces 516 and 518. Top surface 516 is configured to accommodate strip 502. In embodiments, conductive sheet 506 is made of an electrically conductive material such as copper or aluminum.

Conductive sheet 506 has an opening 510 that is open at both top surface 516 and bottom surface 518. In an embodiment, opening 510 is configured to accommodate one tag of strip 502 being placed over opening 510. In FIG. 5A, tag 504 is placed on top of opening 510.

Strip 502 is made up of a plurality of tags 504 joined in a single row in a side-by-side sequential arrangement. However, in alternate embodiments strip 502 can include multiple rows of tags 504. Strip 502 is moved across conductive sheet 506 (e.g. either left or right in FIGS. 5A and 5B depending on the particular implementation) as each tag 504 is tested. For example, strip 502 may be moved across conductive sheet 506 in a continuous or step fashion, in a manner similar to a conveyor belt. Thus, tag testing apparatus 500 may include wheels, gears, and or other mechanisms for moving strip 502, and for accurately positioning a desired one of tags 504 over opening 510. For example, a computer system may control movement of strip 502, and may use a vision system or other position monitoring system for monitoring a position of strip 502.

As shown in FIG. 5A, each tag 504 in strip 502 has a pair of antennas 512a and 512b configured to have orthogonal polarizations. In particular, tag 504a has a first antenna 512a and a second antenna 512b that have orthogonal polarizations. Although, FIG. 5A shows each tag having two dipole antennas arranged orthogonally, antennas 512a and 512b of each tag 504 of strip 502 may be other types of antennas arranged orthogonally, as would be understood by persons skilled in the relevant art(s).

Antenna 508 is positioned adjacent to opening 510, on the opposite side of conductive sheet 506 from strip 502. Antenna 508 is used to test one tag at a time of strip 502, such as tag 504a. As shown in FIG. 5B, antenna 508 is substantially planar. However, in alternate embodiments, antenna 508 may be formed in a variety of other shapes as would be understood by persons skilled in the relevant art(s). In an embodiment, antenna 508 is a patch-type antenna. In an embodiment, antenna 508 is at least partially made of a conductive material such as copper or aluminum. Antenna 508 has a first port 510a at a first location that receives a first input signal 514a, and a second port 510b at a second location that receives a second input signal 514b. First input signal 514a received at first port 510a results in antenna 508 radiating signal 514a with a first polarization. Similarly, second input signal 514b received at second port 510b results in antenna 508 radiating signal 514b with a second polarization that is orthogonal to the first polarization.

In an embodiments, antenna 508 is oriented such that first signal 514a radiated with the first polarization excites only first antenna 512a of tag 504a, while second antenna 512b of tag 504a is not excited. Second signal 514b radiated with a second polarization excites only second antenna 512b while first antenna 512a of tag 504a is not excited. Thus, tag 504a is held over opening 510 in a manner to maintain this relationship with antenna 508. Strip 502 is passed over opening 510 to allow each tag of strip 502 to be tested to be held over opening 510 in this manner.

Conductive sheet 506 shields tags 504 not positioned above opening 510 from radiation emanating from antenna 508. Thus tests being performed on tag 504a do not substantially affect other tags 504 in strip 502.

When tag 504a is positioned above opening 510, antenna 508 radiates first signal 514a. Tag 504a receives first signal 514a and a response of tag 504a is measured. For example, first signal 514a may be an interrogation signal and tag 504a may respond with an identification number that identifies tag 504a. Similarly, antenna 508 radiates second signal 514b. Tag 504a receives second signal 514b and a response of tag 504a is measured. In an embodiment, first signal 514a tests first antenna 512a and second signal 514b tests second antenna 514b. If tag 504a fails to respond to either first signal 514a or second signal 514b, then at least one antenna (or related functionality, such as a demodulator) of tag 504a is known not to be functioning properly. In such a situation, tag 504a may be marked for discard, recycling, or repair.

Testing apparatus 500 may also include an electromagnetic (EM) radiation source (other than antenna 508). The EM radiation source may be configured such that radiation radiated by the source is incident on tags 504 of strip 502 that are not under test (not on top of opening 510). Radiation radiated by the EM radiation source causes the tags to be disabled (e.g. by disabling a circuit of the tags), as described in further detail below. In a further embodiment, a tag 504 of strip 502 may include a radiation sensor configured to respond to radiation radiated by the source. Radiation from the source incident on the sensor may result in the sensor communicating with an electrical circuit of tag 504 of strip 502 such that tag 504 of strip 502 is rendered unresponsive to signals transmitted by antenna 508. A shielding element, such as a protective film or an electrically conductive material, may be used to shield tag 504 of strip 502 under test from radiation radiated by the source.

Figure 6A:
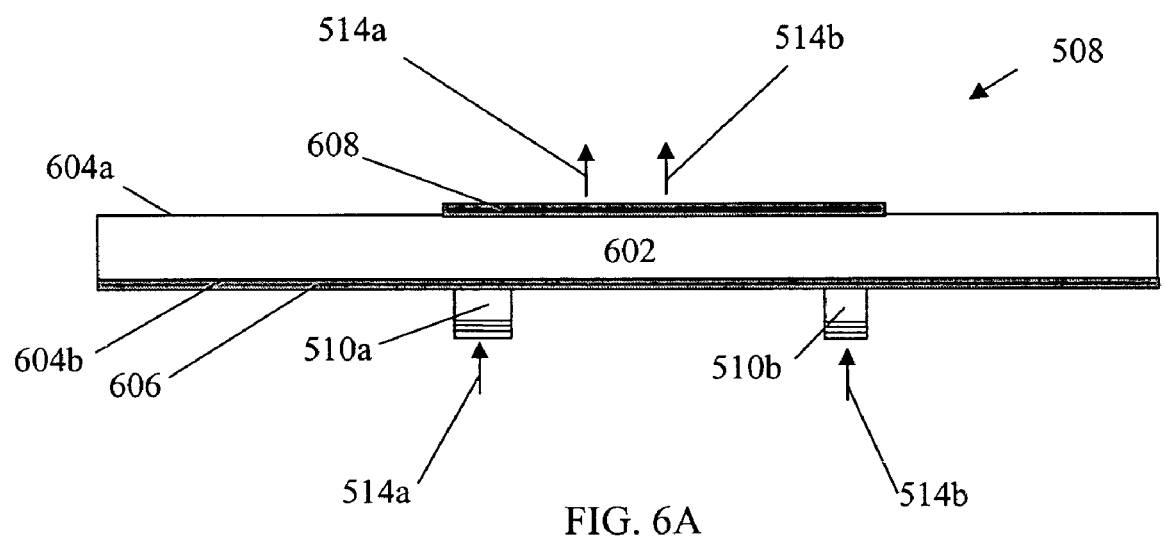
FIG. 6A shows a cross-sectional side an RFID tag testing antenna, according to an example embodiment of the present invention.
Figure 6B:
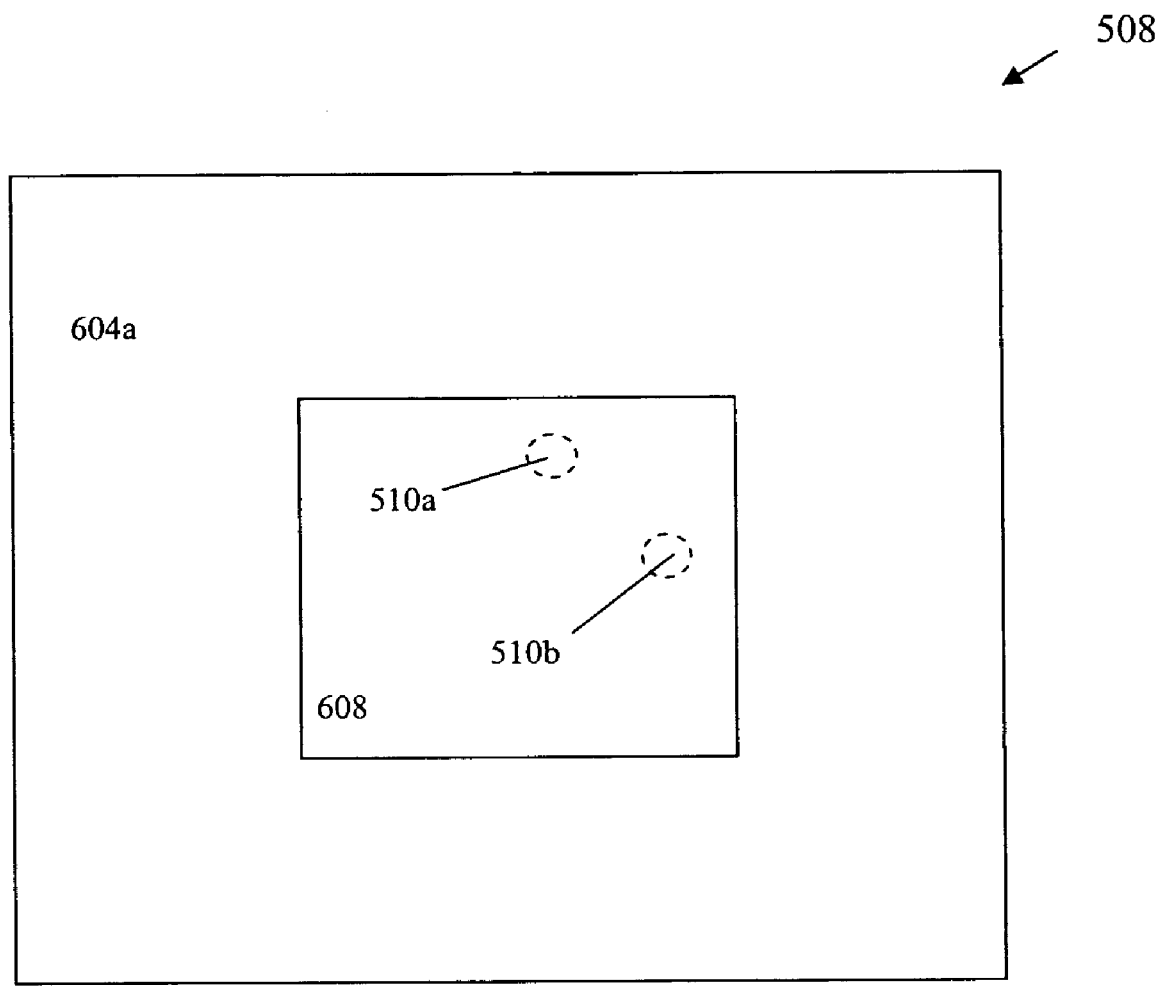
FIGS. 6B and 6C show top views of RFID tag testing antennas, according to example embodiments of the present invention.

FIGS. 6A and 6B show side and top views of antenna 508 respectively according to an embodiment of the present invention. As shown in FIG. 6A, antenna 508 includes a substrate 602, a radiating element 608, a conductive layer 606, first port 510a, and second port 510b. Substrate 602 has top surface 604a and bottom surface 604b. FIG. 6A shows substrate 602 to be substantially planar. However, substrate 602 may also be curved. Substrate 602 is made of a dielectric material such as FR-4.

FIG. 6A shows bottom surface 604b attaching conductive layer 606. In an embodiment, conductive layer 606 on bottom surface 604b serves as a ground plane for antenna 508. Conductive layer 606 is made up of an electrically conductive material, such as a metal.

Radiating element 608 may be a patch antenna radiating element, or other type of radiating element. For example, radiating element 608 may be a half-wave patch antenna, (i.e. a square patch with the length of each side equal to half of a wavelength of an operating frequency). However, in other embodiments, radiating element 608 may be another antenna type configured to generate orthogonal RF signals, such a pair of perpendicularly oriented dipole antennas, etc. In the example of FIGS. 6A and 6B, radiating element 608 is shown located in a center portion of top surface 604a and radiating element 608 is shown to be substantially planar from a side view. FIG. 6B shows radiating element 608 to be substantially rectangular from a top view. In alternate embodiments, however, radiating element 608 may be other shapes such as round or elliptical. Moreover, in alternate embodiments, radiating element 608 may have one or more openings and/or may not be continuous. In a further embodiment, radiating element 608 is made up of an electrically conductive material, including a metal such as copper or aluminum.

FIG. 6A shows first port 510a and second port 510b coupled to conductive layer 606. A ground portion of first port 510a and second port 510b is electrically coupled to conductive layer 606 and a signal portion of first port 510a and second port 510b is electrically coupled to radiating element 608. For example, ports 510a and 510b may be SubMiniature version A (SMA) coaxial input ports, where an outer conductor is coupled to conductive layer 606 and an inner conductor is coupled to radiating element 608. First port 510a and second port 510b are used to couple RF signals to antenna 508. Other types of conductors for RF signals may be alternatively used, as would be known to persons skilled in the relevant art(s).

Input ports 510a and 510b are positioned on radiating element 608 such that first signal 514a input to first port 510a is radiated with a first polarization from radiating element 608 and second signal 514b input to second port 510b is radiated with second polarization from radiating element 608. In embodiments, the first and second polarizations are orthogonal to each other. Ports 510a and 510b are oriented such that a coupling between ports 510a and 510b is not substantial, such as being less than −20 dB. A 90° symmetry between port 510a and port 510b, as shown in FIG. 6B, may be used to reduce the coupling between port 510a and port 510b.

In an embodiment, antenna 508 is configured to radiate energy such that an antenna of a tag in strip 502 in a near field will be excited, and an antenna of a tag of strip 502 in a far-field will not be excited. For example, a traveling wave antenna implementation, such as in a patch antenna embodiment may be used to accomplish this.

Figure 6C:
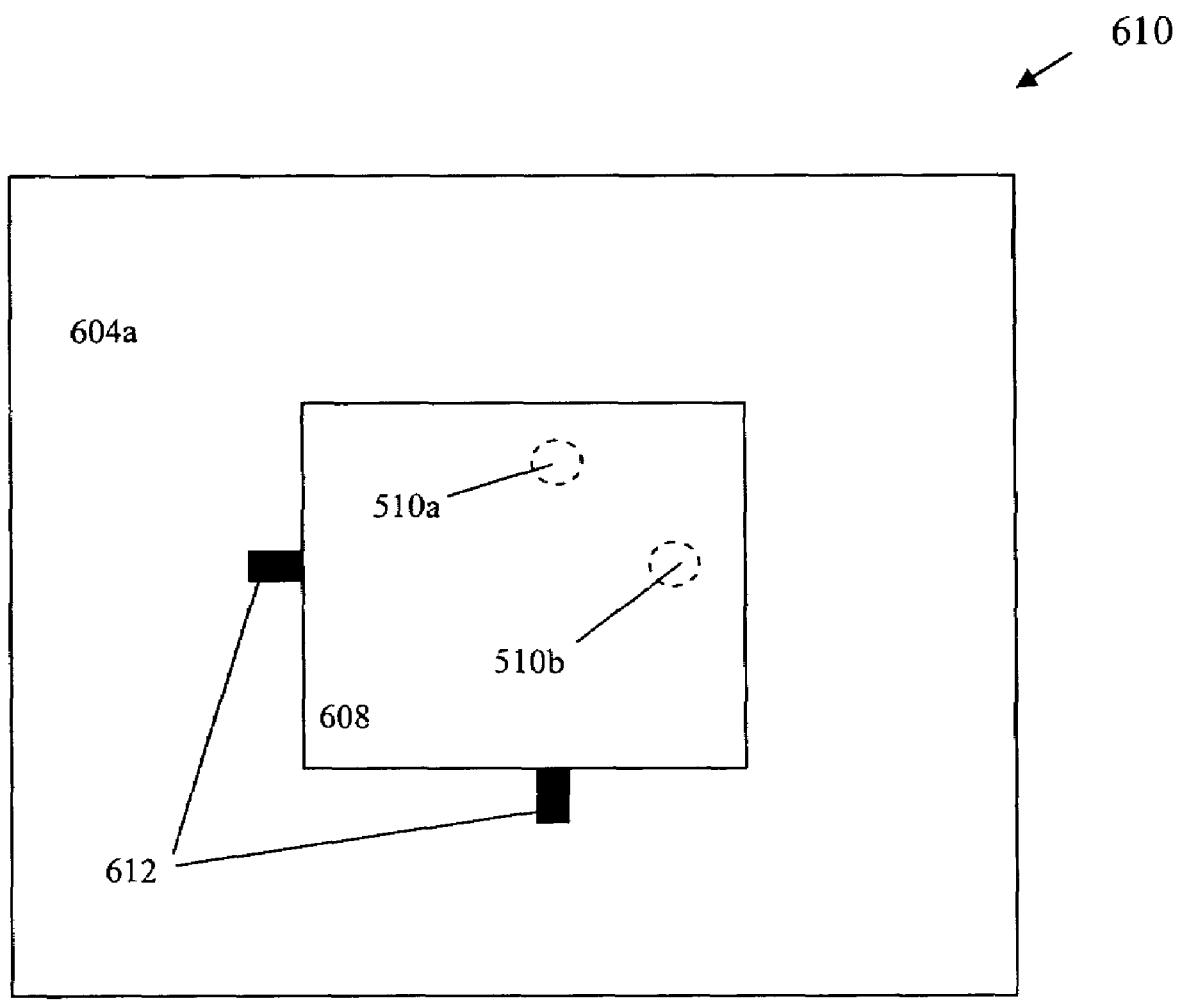

FIG. 6C shows a top view of an antenna 610, according to an embodiment of the present invention. Antenna 610 is substantially similar to antenna 508 shown in FIGS. 6A and 6B except that antenna 610 also includes terminating loads 612 located opposite to ports 510a and 510b. In alternate embodiments, terminating loads 612 may be coupled to any edge of radiating element 608. Moreover, the example of FIG. 6C shows two terminating loads 612, however in alternate embodiments, antenna 610 may include any number of terminating loads 612. Terminating loads 612 aid in reducing a return loss of antenna 610.

Figure 7:
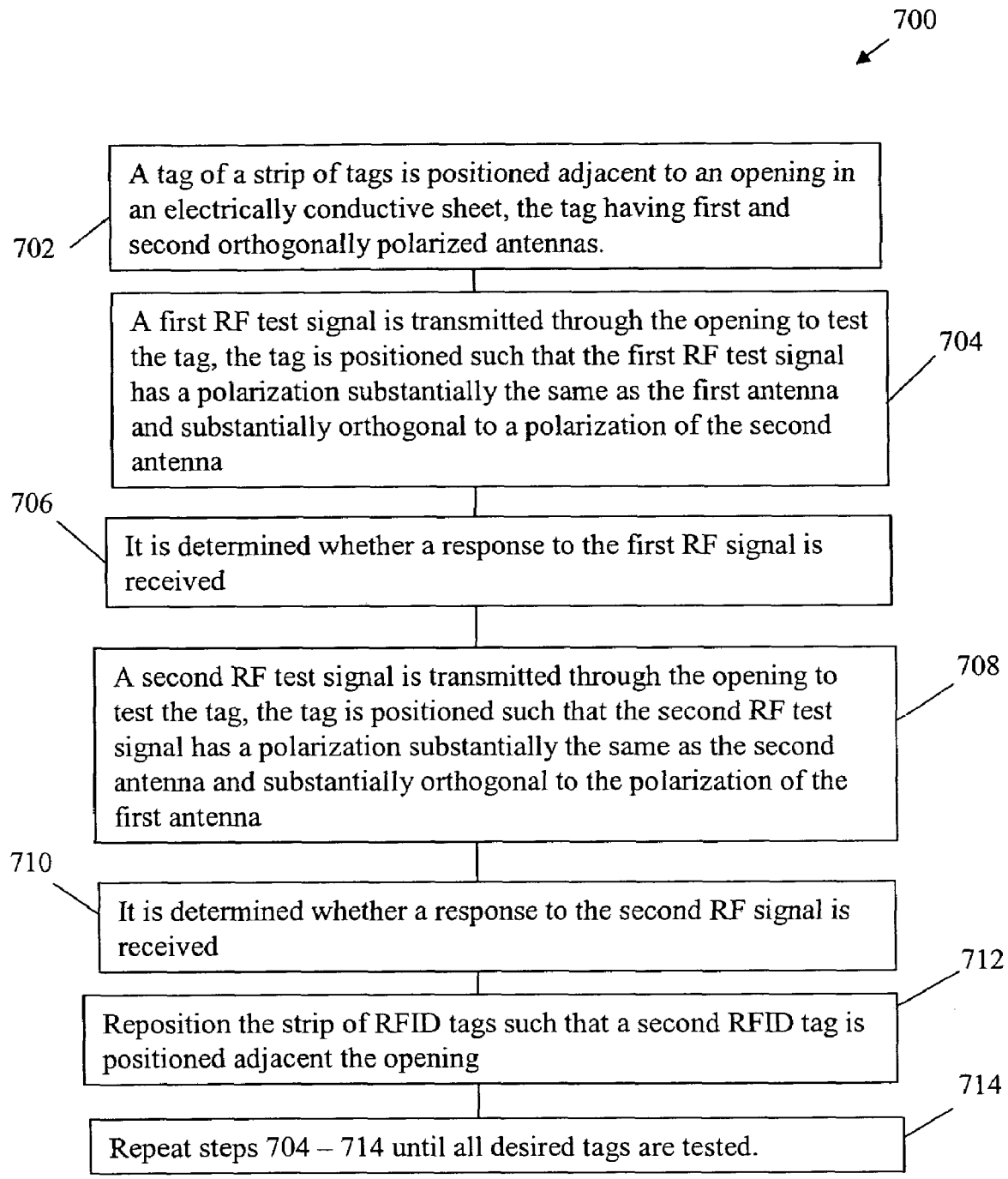
FIG. 7 shows a flowchart providing example steps for testing an RFID tag, according to an example embodiment of the present invention.

FIG. 7 shows a flowchart 700 providing example steps for testing one or more tags of a strip of tags, according to an embodiment of the present invention. Other structural and operational embodiments will be apparent to persons skilled in the relevant art(s) based on the following discussion. The steps shown in FIG. 7 do not necessarily have to occur in the order shown. The steps of FIG. 7 are described in detail below.

Flowchart 700 begins with step 702. In step 702, a tag of a strip of tags is positioned adjacent to an opening in an electrically conductive sheet, the tag having first and second orthogonally polarized antennas. For example, in FIG. 5A, strip 502 of tags 504 is placed on a first surface of conductive sheet 506. Tag 504a is positioned over opening 510. Although tag 504a is shown to be in a middle portion of strip 502, tag 504a may be any tag 504 in strip 502, as would be understood by persons skilled in the relevant art(s).

In step 704, a first RF test signal is transmitted through the opening to test the tag. The tag is positioned relative to a transmitting antenna such that the first RF test signal has a polarization substantially the same as the first tag antenna and substantially orthogonal to a polarization of the second tag antenna. For example in FIG. 5B, first signal 514a is transmitted through opening 510. Tag 504a is positioned such that a polarization of first signal 514a is substantially the same as a polarization of first antenna 512a and is substantially orthogonal to a polarization of second antenna 512b.

In step 706, it is determined whether a response to the first RF test signal is received. For example in FIG. 5A, it is determined whether tag 504a responded to first signal 514a.

In step 708, a second RF test signal is transmitted through the opening to test the tag. The tag is positioned relative to the transmitting antenna such that the second RF test signal has a polarization substantially the same as the second tag antenna and substantially orthogonal to the polarization of the first tag antenna. For example in FIG. 5B, second signal 514b is transmitted through opening 510. Tag 504a is positioned such that a polarization of second signal 514b is substantially the same as the polarization of second antenna 512b and substantially orthogonal to the polarization of the first antenna 512a.

In step 710, it is determined whether a response to the second RF test signal is received. For example in FIG. 5A, it is determined whether tag 504a responded to second signal 514b.

In step 712, the strip of RFID tags is repositioned such that a second RFID tag is positioned adjacent the opening. For example in FIG. 5A, strip 502 is repositioned so a tag of tags 504 that is adjacent to tag 504a is position adjacent to opening 510.

In step 714, steps 704-712 are repeated until all desired tags of the strip of tags have been tested.

Note the in an embodiment, the testing procedure set out by flowchart 700 can be manually controlled or automated using a central logic structure such a computer.

In an embodiment, as described above, an electromagnetic radiation source may expose with radiation tags 504 of strip 502, other than a tag 504 under test (on top of opening 510), to prevent these tags from responding to signals radiated by the antenna. In one embodiment, the radiation directly disables electrical circuitry of the tags to disable them. In another embodiment, the radiation radiated by the source is incident on a sensor of a tag 504 of strip 502 not under test. The sensor may communicate with an electrical circuit of tag 504 of strip 502 to render tag 504 of strip 502 unresponsive to signals transmitted by antenna 508. Any type or frequency of radiation may be used including visible light, infrared light, X-rays, etc. A halogen bulb, LED, or other electromagnetic radiation source may be used. Tag 504 of strip 502 under test may be shielded from radiation radiated by the source through the use of a shielding element such as a protective film or an electrically conductive material.

Although the embodiments discussed above refer to one tag being tested at a time, this process can also be extended such that multiple tags are tested simultaneously. For example, a strip of tags may include a serial stream of tags or may include tags in parallel stream of rows.

Example Computer System Embodiments

In this document, the terms "computer program medium" and "computer usable medium" are used to generally refer to media such as a removable storage unit, a hard disk installed in hard disk drive, and signals (i.e., electronic, electromagnetic, optical, or other types of signals capable of being received by a communications interface). These computer program products are means for providing software to a computer system. The invention, in an embodiment, is directed to such computer program products.

In an embodiment where aspects of the present invention are implemented using software, the software may be stored in a computer program product and loaded into a computer system using a removable storage drive, hard drive, or communications interface. The control logic (software), when executed by a processor, causes the processor to perform the functions of the invention as described herein.

According to an example embodiment, a computer system may execute computer-readable instructions to perform the test procedures further described above.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of testing a strip of radio frequency identification (RFID) tags comprising:
   (1) positioning a tag of a strip of tags adjacent to an opening in an electrically conductive sheet, wherein the tag has orthogonally polarized first and second antennas;
   (2) transmitting a first RF test signal through the opening, wherein the tag is positioned such that the first RF test signal has a polarization that is substantially the same as a polarization of the first antenna and is substantially orthogonal to a polarization of the second antenna;
   (3) determining whether a response to the first RF test signal is received using a central logic structure;
   (4) transmitting a second RF test signal through the opening, wherein each tag positioned adjacent to the opening is positioned such that the second RF test signal has a polarization that is substantially the same as the polarization of the second antenna and is substantially orthogonal to the polarization of the first antenna; and
   (5) determining whether a response to the second RF test signal is received using the central logic structure.

2. The method of claim 1, further comprising:
   (6) positioning a second tag of the strip of RFID tags positioned adjacent the opening; and
   (7) repeating steps (2)-( 5).

3. The method of claim 1, further comprising:
   (6) exposing a second tag of the strip not positioned adjacent to the opening to electromagnetic radiation, whereby the second tag is disabled from responding to the first RF test signal and the second RF test signal.

4. The method of claim 3, where step (6) further comprises: using a Halogen bulb to provide the electromagnetic radiation.

5. The method of claim 3, where step (6) further comprises: exposing a sensor of the second tag of the strip of tags to the electromagnetic radiation, whereby the second tag is disabled from responding to the first RF test signal and the second RF test signal.

6. The method of claim 3, further comprising: (7) shielding the first tag from the electromagnetic radiation by using a shielding element.

7. The method of claim 1, wherein the first antenna and the second antenna of each tag of the tags positioned adjacent to the opening are dipole antennas positioned such that the polarization of the first antenna is orthogonal to the polarization of the second antenna.

8. The method of claim 1, wherein step (3) further comprises: marking the tag if it is determined that a response to the first RF test signal is not received.

9. The method of claim 1, wherein step (5) further comprises: marking the tag if it is determined that a response to the second RF test signal is not received.

10. A radio frequency identification (RFID) tag testing apparatus comprising:
   a conductive sheet having an opening through a center portion, wherein the conductive sheet is configured to accommodate a strip of tags, wherein the opening is configured to accommodate a tag of the strip; and
   an antenna positioned adjacent to the opening, wherein the antenna transmits at least a first electromagnetic wave toward the opening and a second electromagnetic wave toward the opening, wherein a polarization of the first electromagnetic wave is orthogonal to a polarization of the second electromagnetic wave.

11. The testing apparatus of claim 10, wherein the conductive sheet shields tags in the strip not positioned in the opening from electromagnetic waves transmitted from the antenna.

12. The testing apparatus of claim 10, wherein the antenna comprises:
   a substrate having opposing first and second surfaces, wherein the first surface of the substrate includes a patch of a conductive material;
   a first port coupled to the second surface at a first location, wherein an input signal received at the first port is transmitted as the first electromagnetic wave from the antenna; and
   a second port coupled to the second surface at a second location, wherein an input signal received at the second port is transmitted as the second electromagnetic wave from the antenna.

13. The testing apparatus of claim 12, wherein the first port and the second port are substantially isolated.

14. The testing apparatus of claim 12, wherein a coupling factor between the first port and the second port is less than −20 dB.

15. The testing apparatus of claim 12, wherein the patch is rectangular shaped, wherein the patch is located in a center of the first surface of the substrate.

16. The testing apparatus of claim 12, wherein the rectangular patch has at least one edge that has a length equal to half of a wavelength of the input signal.

17. The testing apparatus of claim 12, wherein at least one terminating load is coupled to an edge of the patch.

18. The testing apparatus of claim 12, wherein the conductive material is copper or aluminum.

19. The testing apparatus of claim 10, wherein the antenna is configured to transmit the first and second electromagnetic waves in a near-field range of the antenna.

20. The testing apparatus of claim 19, wherein the antenna is configured to transmit the first and second electromagnetic waves such that tags in a far-field range of the antenna do not respond.

21. The testing apparatus of claim 10, wherein the antenna is configured to transmit the first electromagnetic wave to cause a first antenna of a tag positioned in the opening to receive the first electromagnetic wave and a second antenna of the tag positioned in the opening to not substantially receive the first electromagnetic wave.

22. The testing apparatus of claim 12, wherein the substrate comprises FR4.

23. The testing apparatus of claim 12, wherein the first and second ports are positioned symmetrically on the second surface of the substrate.

24. The testing apparatus of claim 12, wherein the second surface of the substrate is substantially covered in the conductive material, wherein the first port and the second port each have a first portion electrically coupled to the second surface of the substrate and a second portion electrically coupled to the patch on the first surface of the substrate.

25. The testing apparatus of claim 24, wherein the first portions of the first and second ports are grounded.

26. The testing apparatus of claim 10, wherein only a first antenna of a tag positioned adjacent to the opening is excited by the first electromagnetic wave transmitted by the antenna, and only a second antenna of the tag positioned adjacent to the opening is excited by the second electromagnetic wave transmitted by the antenna.

27. The testing apparatus of claim 10, further comprising an electromagnetic radiation source configured such that a second tag of the strip of tags not positioned adjacent to the opening is exposed to radiation radiated by the source, whereby the second tag of the strip of tags is disabled from responding to the electromagnetic waves transmitted by the antenna.

28. The testing apparatus of claim 27, wherein the source is a halogen bulb.

29. The testing apparatus of claim 27, wherein the source is configured such that radiation radiated by the source is incident on a radiation sensor of the second tag of the strip of tags, whereby the second tag of the strip of tags is disabled from responding to electromagnetic waves transmitted by the antenna.

30. The testing apparatus of claim 27, further comprising a shielding element, wherein the shielding element shields the tag of the strip of tags adjacent to the opening from radiation radiated from the source.

31. A system for testing a strip of radio frequency identification (RFID) tags comprising:
   means for positioning a tag of a strip of tags adjacent to an opening in an electrically conductive sheet, wherein the tag has orthogonally polarized first and second antennas;
   means for transmitting a first RF test signal through the opening, wherein the tag is positioned such that the first RF test signal has a polarization that is substantially the same as a polarization of the first antenna and is substantially orthogonal to a polarization of the second antenna;
   means for determining whether a response to the first RF test signal is received;
   means for transmitting a second RF test signal through the opening, wherein each tag positioned adjacent to the opening is positioned such that the second RF test signal has a polarization that is substantially the same as the polarization of the second antenna and is substantially orthogonal to the polarization of the first antenna; and
   means for determining whether a response to the second RF test signal is received.

* * * * *